United States Patent [19]

Reisman et al.

[11] Patent Number: 4,891,329

[45] Date of Patent: Jan. 2, 1990

[54] METHOD OF FORMING A NONSILICON SEMICONDUCTOR ON INSULATOR STRUCTURE

[75] Inventors: Arnold Reisman, Raleigh; Wei-Kan Chu, Chapel Hill, both of N.C.

[73] Assignees: University of North Carolina, Chapel Hill; Microelectronics Center of North Carolina, Research Triangle Park, both of N.C.

[21] Appl. No.: 277,168

[22] Filed: Nov. 29, 1988

[51] Int. Cl.[4] .............................................. H01L 7/50
[52] U.S. Cl. ...................................... 437/61; 437/974; 437/228; 437/83; 437/86; 437/131; 437/132; 437/133; 148/DIG. 59; 148/DIG. 135; 148/DIG. 12; 148/33.3; 148/33.4
[58] Field of Search ...................... 437/61, 62, 82, 84, 437/974; 148/DIG. 12, DIG. 59, 33.3, 33.4 DIG. 135

[56] References Cited

U.S. PATENT DOCUMENTS

| | | | |
|---|---|---|---|
| 3,959,045 | 5/1976 | Antypas | 148/DIG. 135 |
| 3,976,511 | 8/1976 | Johnson . | |
| 3,989,869 | 11/1976 | Neumaier et al. . | |
| 3,997,381 | 12/1976 | Wanlass . | |
| 4,116,751 | 9/1978 | Zaromb | 148/DIG. 135 |
| 4,142,925 | 3/1979 | King et al. . | |
| 4,200,474 | 4/1980 | Morris . | |
| 4,226,649 | 10/1980 | Davey et al. . | |
| 4,288,470 | 9/1981 | Bate et al. . | |
| 4,495,219 | 1/1985 | Kato et al. . | |
| 4,532,700 | 8/1985 | Kinney et al. . | |
| 4,554,728 | 11/1985 | Shepard . | |
| 4,601,779 | 7/1986 | Abernathey et al. . | |
| 4,649,627 | 3/1987 | Abernathey et al. . | |

OTHER PUBLICATIONS

Wafer Bonding For Silicon-On-Insulator Technologies; J. B. Lasky; Appl. Phys. Lett. 48 (1), 6 Jan. 1986.
A Field-Assisted Bonding Process For Silicon Dielectric Isolation; Frye et al.; J. Electrochem. Soc.; vol. 133, No. 8; Aug. 1986.
MBE-Grown Fluoride Films: A New Class of Epitaxial Dielectrics; Farrow et al.; J. Vac. Sci. Technol. 19(3), Sep./Oct. 1981.
Molecular-Beam Epitaxy of Si On A $CaF_2$/Si (100) Structure; Sasaki et al.; J. Appl. Phys. 59 (9), 1 May 1986.
IEEE Circuits And Devices Magazine; Harry T. Weaver; vol. 3, No. 4; Jul. 1987.

Primary Examiner—Brian E. Hearn
Assistant Examiner—Tuan Nguyen
Attorney, Agent, or Firm—Bell, Seltzer, Park & Gibson

[57] ABSTRACT

A method of forming a nonsilicon semiconductor layer on an insulating layer by forming a thin heteroepitaxial layer of nonsilicon semiconductor on a first substrate having a lattice structure which matches that of the heteroepitaxial layer. A first insulating layer is formed on the heteroepitaxial layer. A second insulating layer is formed on the surface of a second substrate. The first and second insulating layers are bonded together to form a unified structure, and the first substate is etched away. In a preferred embodiment the heteroepitaxial layer is germanium, gallium arsenide or silicon-germanium alloy while the first substrate is silicon, germanium, gallium arsenide or silicon-germanium alloy.

19 Claims, 1 Drawing Sheet

METHOD OF FORMING A NONSILICON SEMICONDUCTOR ON INSULATOR STRUCTURE

FIELD OF THE INVENTION

This invention relates to the fabrication of semiconductor wafers for subsequent formation into discrete and integrated circuit devices, and more specifically to a method of forming a thin nonsilicon semiconductor layer on an insulating layer for subsequent formation of devices in and on the thin nonsilicon semiconductor layer.

BACKGROUND OF THE INVENTION

The production of quality semiconductor on insulator (SOI) structures for very large scale integration applications has become an important aspect of semiconductor fabrication particularly as the dimensions of transistors and other semiconductor structures become smaller and smaller. Semiconductor on insulator technology allows for this shrinkage in structure while providing greater isolation between devices. This isolation is necessary because the problems associated with electromagnetic interference and parasitic capacitance between the structures are magnified as the size of circuits is reduced.

Because silicon is the dominant semiconductor material in present day integrated circuit devices, much effort has been focused on improving silicon on insulator fabrication techniques. Of particular difficulty is controlling the etching of the silicon semiconductor substrate to stop at the thin silicon epitaxial layer. Various techniques have been employed in attempts to control substrate etching. For example, U.S. Pat. No. 3,997,381 to Wanless discloses forming a thin epitaxial silicon layer on a silicon substrate followed by forming a silicon oxide layer on the epitaxial layer. This layered device is bonded to an oxidized second substrate so that the epitaxial layer is sandwiched between the two substrates. The substrates are removed by etching to thereby expose the epitaxial layer. The electromotive force between an electrode pair immersed in the etchant solution is measured during etching, as an oxidizing agent is added, to thereby determine the proper etch end point. Another attempt to control etch end point is described in U.S. Pat. No. 4,601,779 to Abernathy et al in which a buried etch-stop layer is formed in an epitaxial layer by implanting oxygen or nitrogen ions therein. An oxide layer is grown on the epitaxial portion and is used to form a bond with the oxide layer of a support wafer. After bonding, the silicon substrate is etched until the etch-stop, to expose the epitaxial layer. The etch-stop is then removed to form a thin silicon layer having a uniform thickness.

There has also been an increased interest in forming nonsilicon semiconductor on insulator structures. Nonsilicon semiconductors, for example germanium (Ge), gallium arsenide (GaAs) and silicon germanium alloys (Si-Ge) are finding increasing uses in high temperature, high power, optoelectronic, radiation sensitive and other applications. Accordingly, the art has also focused on techniques for producing nonsilicon semiconductor on insulator structures. One such technique is disclosed in U.S. Pat. No. 4,226,649 to Davey et al in which an epitaxial layer of doped n-type gallium arsenide is formed on a germanium substrate. A semiinsulating N+layer of gallium arsenide is grown on the N-type active layer, and a thin cap of germanium is deposited on the composite. Gold is deposited onto the germanium cap to form an eutectic alloy layer with the germanium. The alloy is formed and the composite is bonded to a metal, glass or ceramic substrate. The germanium substrate is then removed to expose the N-layer of gallium arsenide for device formation.

While the Davey et al technique does provide a method of forming a gallium arsenide on insulator structure, the technique is complicated and expensive. A separate N+semiinsulating layer must be provided to prevent the gold layer from creating short circuits in the gallium arsenide. This N+layer may cause leakage problems, leading to degraded device performance and potential reliability problems. The gold bonding layer is expensive, and the large number of process steps creates an expensive gallium arsenide on insulator structure.

SUMMARY OF THE INVENTION

In accordance with the foregoing, it is an object of the present invention to provide a method of fabricating a nonsilicon on insulator structure.

It is another object of the present invention to provide a method of fabricating a nonsilicon on insulator structure which overcomes the problem of critical substrate etch.

It is another object of the present invention to provide a method of making a nonsilicon on insulator structure which is simple, uses inexpensive materials and does not degrade device performance or reliability.

These and other objects are provided in the present invention by first forming a heteroepitaxial nonsilicon semiconductor layer on a first substrate of material other than the nonsilicon semiconductor of the heteroepitaxial layer. As is well known to those having skill in the art, the epitaxial growth process is a means of depositing a thin layer of single crystal material on a single crystal substrate. If the film is the same material as the substrate (for example gallium arsenide deposition on a gallium arsenide substrate), the process is called homoepitaxy. If, on the other hand, the deposit is made on a substrate that is chemically different (for example gallium arsenide deposition on a silicon substrate), the process is called heteroepitaxy.

According to the invention, a thin layer of heteroepitaxial nonsilicon semiconductor is formed on a substrate having a lattice structure on which silicon may be grown. For example, a germanium heteroepitaxial layer may be formed on a silicon or germanium silicon alloy substrate; or a gallium arsenide heteroepitaxial layer may be formed on germanium or silicon substrate; or a silicon germanium alloy heteroepitaxial layer may be formed on a gallium arsenide substrate. A first insulating layer is then formed on the heteroepitaxial layer, for example by oxidation or by chemical vapor deposition. A second insulating layer is formed on a second substrate which may or may not be a semiconductor, and the first and second insulating layers are bonded together to form a unified structure. The first substrate is then removed from the unified structure to expose the heteroepitaxial layer on the bonded insulating layers.

In the method of the present invention, the heteroepitaxial layer is exposed by etching the first substrate. Since the heteroepitaxial layer and the first substrate are different materials, etch stop at the thin heteroepitaxial silicon layer is easy to control. The process uses oxide, for example silicon dioxide ($SiO_2$), as a bonding layer and as an insulator, so that expensive materials like gold are not needed, nor are special N+ semiinsulating layers. The oxide ensures complete insulation without the risk of substrate shorting or leakage. Finally, the process is simple and easy to control.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art.

Like characters refer to like elements throughout. For greater clarity, the thickness of the layers has been exaggerated.

Figure 1A:
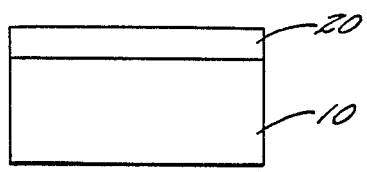
FIGS. 1A-1D are cross-sectional views schematically illustrating certain stages of an embodiment of the method of the present invention.

Referring to FIGS. 1A-1D, a method of forming a thin nonsilicon semiconductor layer or film on an insulating layer to form a nonsilicon semiconductor on insulator structure, according to the present invention, is shown. In FIG. 1A, a substrate 10 has grown or formed thereon a thin crystalline nonsilicon heteroepitaxial layer 20, preferably 0.1 to 5 micrometers thick. To facilitate heteroepitaxial growth, substrate 10 may have a lattice structure substantially the same as the lattice structure of the heteroepitaxial layer (for example, with lattice spacings within ±2% of that of the epitaxial layer). Exemplary substrates and heteroepitaxial layers will be described in detail below, as will exemplary heteroepitaxial formation techniques. It is also contemplated that other heteroepitaxial formation techniques and materials will be usable in the present invention as they become available. For example, work is presently underway to heteroepitaxially deposit diamond film semiconductors on monocrystalline nickel.

Figure 1B:
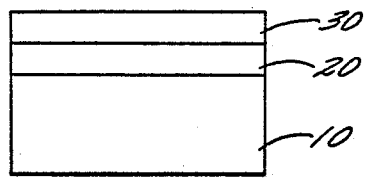

As shown in FIG. 1B, an insulating layer 30, preferably 0.01 to 0.10 micrometers thick, such as silicon dioxide, is then deposited or otherwise formed on heteroepitaxial layer 20.

Figure 1C:
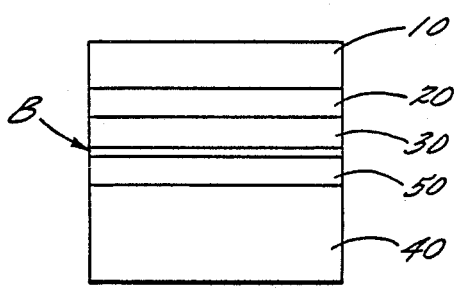

Referring now to FIG. 1C, a second substrate 40, which may be silicon, has an insulating layer 50, for example of silicon dioxide deposited or formed thereon, preferably 0.01 to 0.10 micrometers thick. Then, insulating layer 30 is bonded to insulating layer 50 as shown at B. Typically, this is accomplished by thermally bonding insulating layers 30 and 50 together face-to-face to form a unified structure. Exemplary bonding techniques are disclosed in an article by Lasky entitled "Wafer Bonding For Silicon-On-Insulator Technologies" published in Applied Physics Letters, Vol. 48, No. 1, Jan. 6, 1986, and in an article by Frye et al entitled "A Field-Assisted Bonding Process For Silicon Dielectric Isolation" published in Journal of the Electrochemical Society, Vol. 133, No. 8, August 1986, the disclosures of which are hereby incorporated herein by reference. It will be understood by those having skill in the art that such bonding must be conducted below the melting point of any material present.

Figure 1D:
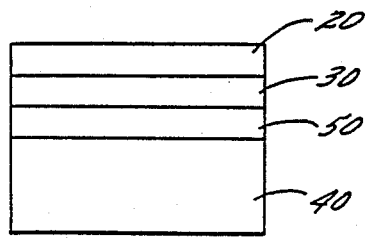

The substrate 10 of the unified structure of FIG. 1C is then substantially entirely etched away using an appropriate etchant or using any other commonly available etching process such as wet chemistry, plasma or reactive ion etching. The particular etching employed will depend on the materials chosen for substrate 10 and heteroepitaxial layer 20; examples for a number of materials are described below. The resulting unified nonsilicon semiconductor on insulator structure is shown in FIG. 1D. Due to the dissimilarities between heteroepitaxial layer 20 and substrate 10, the heteroepitaxial layer is an effective etch-stop and obviates the problems associated with prior techniques. Moreover, the oxide bonding layer provides an excellent insulator, and an inexpensive process.

The above description has described the process of the present invention in general terms. The description will now turn to a discussion of several specific examples of the invention

EXAMPLE 1

Referring once again to FIGS. 1A-D, the method of the present invention is described using Si as etchable first substrate 10 and Ge as heteroepitaxial layer 20. If the silicon substrate has a (100) orientation, then the Ge has a similar crystalline orientation. The Ge heteroepitaxial layer is formed as a thin single crystalline layer on the first substrate using CVD, MBE or other suitable techniques. The thickness of epitaxial layer 20 ranges from 0.1 to 5 $\mu$m. Insulating layer 30 of silicon dioxide ($SiO_2$) is deposited on heteroepitaxial layer 20 to form the structure of FIG. 1B. Insulating layer 30 ranges in thickness from 0.01 to 0.10 $\mu$m.

The structure of FIG. 1B may also be formed by implanting Ge into the Si first substrate 10 to a depth of 0.01 to 0.03 $\mu$m using a Ge dose of $10^{15}$–$10^{16}$/cm$^2$, and then heating to approximately 1050° C. During heating, in an oxidizing ambient atmosphere the implanted Ge recrystallizes and develops a heteroepitaxial relationship with the Si, and $SiO_2$ simultaneously forms on the surface of the Ge. The thickness of heteroepitaxial layer 20 and insulating layer 30 depends on the amount of Ge implanted and the time and temperature of heating.

The structure of FIG. 1B may also be formed by forming heteroepitaxial Ge layer 20 on Si substrate 10 and then forming $SiO_2$ layer 30 through the Ge layer 20 from the underlying Si substrate 10. Si passes through Ge layer 20 to the Ge-air interface by a diffusion process. $SiO_2$ is then formed by oxidizing at a temperature of approximately 800° C. for approximately 100 minutes. Alternatively, the $SiO_2$ layer may be deposited by chemical vapor deposition (CVD) using a silane-oxygen mixture at 400° C.–50° C. at 200–400 mTorr pressure.

Referring to FIG. 1C, a second substrate 40, which may be silicon, pressed poly, fused silica, or other suitable substrate material, has an insulating layer 50, preferably silicon dioxide or silicon oxide, grown or deposited thereon. Insulating layer 50 ranges from 0.01 to 0.1 $\mu$m in thickness.

Next, the insulating layer 30 is bonded to the insulating layer 50 as shown in FIG. 1C at B. Typically, this is accomplished by thermally bonding the insulating layers together face-to-face to form a unified structure by heating at 900° C. for 90 minutes in steam using a weight of 300–500 g to hold the structures together.

Substrate 10 is then etched away using an appropriate acid or using any other commonly available etching process such as wet chemistry, plasma or reactive ion etching. By way of example, when Si is used for substrate 10 and Ge is used as an epitaxial layer, the following etchants in the following concentrations may be employed: a mixture of 17 ml ethylene diamine, 3 g pyrocatechol, 8 ml water ±2-4 g/l of this solution of pyrazine (1,4 diazine) as per A. Reisman et al, The Controlled Etching of Silicon in Catalyzed Ethylene Diamine-Pyrocatechol-Water Solutions in the temperature range 50°-119° C.

EXAMPLE 2

Referring once again to FIGS. 1A–D, the method of the present invention is described using Si as substrate 10 and Si-Ge alloy as heteroepitaxial layer 20. The Si-Ge alloy has the same crystalline orientation as the underlying silicon substrate. The Si-Ge alloy epitaxial layer is formed as a thin single crystalline layer on the first substrate using CVD, MBE or other suitable techniques. In particular, heteroepitaxial Si-Ge alloy layer is formed on a Si substrate by an MBE technique using silane and germane gas sources. The thickness of the epitaxial layer ranges from 0.01 to 0.03 $\mu$m.

As shown in FIG. 1B, an insulating layer 30, such as silicon dioxide ($SiO_2$) is deposited on the heteroepitaxial layer of Si-Ge alloy 20. Insulating layer 30 ranges in thickness from 0.01 to 0.1 $\mu$m. Second substrate 20 and insulator 50 are formed and bonded as was described with respect to Example 1. Substrate 10 is then etched away using an appropriate acid or using any other commonly available etching process such as wet chemistry, plasma or reactive ion etching. By way of example, when Si is used as substrate 10 and Si-Ge alloy is used as heteroepitaxial layer 20, the following etchants in the following concentrations may be employed: A mixture of 17 ml ethylene diamine, 3 g pyrocatechol, 8 ml water ±2-4 g/l of this solution of pyrazine (1,4 diazine).

EXAMPLE 3

Referring once again to FIGS. 1A–D, the method of the present invention is described using GaAs as substrate 10 and an Si-Ge alloy as heteroepitaxial layer 20. Note that a Ge heteroepitaxial layer may also be used with a GaAs first substrate. The Si-Ge alloy has the same crystalline orientation as the underlying substrate. The Si-Ge alloy heteroepitaxial layer is formed as a thin single crystalline layer on the first substrate using CVD, MBE or other suitable techniques. In particular, heteroepitaxial Si-Ge alloy layer 20 may be formed preferably by MBE. The thickness of the epitaxial layer ranges from 0.1 $\mu$m to 1.0 $\mu$m.

As shown in FIG. 1B, an insulating layer 30, such as silicon dioxide ($SiO_2$) is deposited or grown on heteroepitaxial layer of Si-Ge alloy 20. Insulating layer 30 ranges in thickness from 0.01 to 0.1 $\mu$m. Second substrate 40 and insulator 50 are formed and bonded as was described with respect to Example 1. Then, substrate 10 is etched away using an appropriate acid or etchant or using any other commonly available etching process such as wet chemistry, plasma or reactive ion etching. When GaAs is used as a first substrate 10, Si-Ge alloy is used as heteroepitaxial layer 20, the following etchants in the following concentrations may be employed: 99% by weight MEOH to one part by weight $Br_2$ at 60° C.

EXAMPLE 4

Referring once again to FIGS. 1A–D, the method of the present invention is described using Ge as first substrate 10 and GaAs as heteroepitaxial layer 20. The GaAs has the same crystalline orientation as the Ge substrate lattice structure. The GaAs heteroepitaxial layer is formed as a thin single crystalline layer on the first substrate using CVD, MBE or other suitable means. In particular, heteroepitaxial GaAs layer 20 may be formed by a CVD or MBE process. The thickness of the epitaxial layer ranges from 0.1 to 1.0 $\mu$m.

As shown in FIG. 1B, an insulating layer 20, such as silicon dioxide ($SiO_2$) is deposited on heteroepitaxial layer 20 of Si-Ge alloy by a CVD process at approximately 400°-450° C. Insulating layer 30 ranges in thickness from 0.01 to 0.10 $\mu$m. Second substrate 20 and insulator 50 are formed and bonded as was described with respect to Example 1. Then, substrate 20 is etched away using an appropriate acid or using any other commonly available etching process such as wet chemistry, plasma or reactive ion etching. When Ge is used as substrate 10 and GaAs is used as heteroepitaxial layer 20, the following etchants in the following concentrations may be employed: $1HF:H_2O_2:4H_2O$ by volume at 25° C. at 0.5 $\mu$m/min. or $1HF:2HNO_3:4H_2O$ by volume at 25° C.

EXAMPLE 5

Referring once again to FIGS. 1A–D, the method of the present invention is described using a Ge-Si alloy as substrate 10 and Ge as heteroepitaxial layer 20. Note that a heteroepitaxial layer of Ge, Ge-Si alloy or GaAs may also be employed with a Ge-Si alloy first substrate. In this example, the Ge is assumed to have a (100) crystalline orientation. The Ge alloy heteroepitaxial layer is formed as a thin single crystalline layer on the first substrate using CVD, MBE or other suitable means. In particular, heteroepitaxial Ge layer 20 may be formed by deposition from a $GeH_4$-$H_2$ mixture. The thickness of the epitaxial layer ranges from 0.1 to 1.0 $\mu$m.

As shown in FIG. 1B, an insulating layer 30, such as silicon dioxide ($SiO_2$) is grown or deposited on the heteroepitaxial layer of Si-Ge alloy 20 by standard CVD techniques. Insulating layer 30 ranges in thickness from 0.01 to 0.1 $\mu$m. Second substrate 40 and insulator 50 are formed and bonded as was described with respect to Example 1. Then first substrate 10 is etched away using an appropriate acid or using any other commonly available etching process such as wet chemistry, plasma or reactive ion etching. When Ge-Si alloy is used as a substrate 10 and Ge is used as heteroepitaxial layer 20, the following etchants in the following concentrations may be employed: 17 ml ethylene diamine, 3 g pyrocatechol, 8 ml water ±2-4 g/l +2-4 b/l of this solution of 1,4 diazine.

It will be seen that the method of the present invention provides an effective way of forming a nonsilicon semiconductor on insulator structure which can be utilized for a plurality of semiconductor devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which we claim is:

1. A method of forming a nonsilicon semiconductor layer on an insulating layer comprising the steps of:
   (a) forming a heteroepitaxial nonsilicon semiconductor layer on a first substrate;
   (b) forming a first insulating layer on said heteroepitaxial nonsilicon semiconductor layer;

(c) forming a second insulating layer on a second substrate;

(d) bonding together said first and second insulating layers; and, (e) removing said first substrate.

2. The method of claim 1 wherein said first substrate is selected from the group consisting of: silicon, germanium, gallium arsenide or silicon-germanium alloy.

3. The method of claim 1 wherein said first substrate is a semiconductor material.

4. The method of claim 1 wherein said heteroepitaxial nonsilicon semiconductor layer is selected from the group consisting of: germanium, gallium arsenide or silicon-germanium alloy.

5. The method of claim 1 wherein said first substrate is a crystalline material having a crystal structure which matches that of said heteroepitaxial nonsilicon semiconductor layer.

6. The method of claim 1 wherein step (b) comprises the step of forming a silicon dioxide layer on the heteroepitaxial layer.

7. The method of claim 1 wherein step (c) comprises the step of forming a silicon dioxide layer on said second substrate.

8. The method of claim 1 wherein said second substrate is crystalline silicon.

9. The method of claim 1 wherein said bonding step (d) comprises the step of thermally bonding said first and second insulating layers.

10. The method of claim 1 wherein said removing step (e) comprises the step of etching said first substrate with an etchant which does not etch said heteroepitaxial nonsilicon semiconductor layer to thereby etch away said first substrate and stop at said heteroepitaxial nonsilicon semiconductor layer.

11. A method of forming a semiconductor layer on an insulating layer comprising the steps of:

(a) forming a heteroepitaxial layer selected from the group consisting of germanium, gallium arsenide or silicon-germanium alloy, on a first substrate selected from the group consisting of silicon, germanium, gallium arsenide or silicon-germanium alloy;

(b) forming a first insulating layer on said heteroepitaxial layer;

(c) forming a second insulating layer on a second substrate;

(d) bonding said first and second insulating layers; and (e) removing said first substrate.

12. The method of claim 11 wherein said heteroepitaxial layer is germanium, wherein said first substrate is silicon and wherein said removing step (e) comprises the step of etching away said first substrate in a solution of ethylene diamine pyrocatechol water 1,4 diazine.

13. The method of claim 11 wherein said heteroepitaxial layer is silicon-germanium alloy, wherein said first substrate is silicon and wherein said removing step (e) comprises the step of etching away said first substrate in a solution of ethylene diamine pyrocatechol water 1,4 diazine.

14. The method of claim 11 wherein said heteroepitaxial layer is silicon-germanium alloy, wherein said first substrate is gallium arsenide and wherein said removing step (e) comprises the step of etching away said first substrate in a solution of methanol-Br, solution.

15. The method of claim 11 wherein said heteroepitaxial layer is gallium arsenide, wherein said first substrate is germanium and wherein said removing step (e) comprises the step of etching away said first substrate in a solution of HF, $H_2O$, $H_2O$.

16. The method of claim 11 wherein said heteroepitaxial layer is germanium, wherein said first substrate is silicon-germanium alloy and wherein said removing step (e) comprises the step of etching away said first substrate in a solution of ethylene diamine pyrocatechol water 1,4 diazine solution.

17. A method of forming a germanium on insulator structure comprising the steps of:

(a) implanting germanium under a surface of a silicon first substrate;

(b) heating to recrystallize the germanium on said surface of said silicon first substrate while forming a layer of silicon dioxide on the recrystallized germanium layer;

(c) forming an insulating layer on a second substrate;

(d) bonding together said layer of silicon dioxide and said insulating layer; and (e) removing said first substrate.

18. The method of claim 17 wherein said insulating layer is silicon dioxide.

19. The method of claim 17 wherein said removing step (e) comprises the step of etching away said first substrate in a solution of ethylene diamine pyrocatechol water with 1,4 diazine solution.

* * * * *

UNITED STATES PATENT AND TRADEMARK OFFICE
CERTIFICATE OF CORRECTION

PATENT NO. : 4,891,329

DATED : January 2, 1990

INVENTOR(S) : Reisman et al.

It is certified that error appears in the above-identified patent and that said Letters Patent is hereby corrected as shown below:

Column 5, line 5, "±2-4 g/l" should be --+ 2-4g/l--

Column 5, line 36, "±2-4 g/l" should be --+ 2-4g/l--

Column 6, line 50, "±2-4 g/l +2-4 b/l" should be --+ 2-4g/l--

Signed and Sealed this

First Day of January, 1991

Attest:

HARRY F. MANBECK, JR.

Attesting Officer

Commissioner of Patents and Trademarks